United States Patent [19]

Takagi et al.

[11] Patent Number: 5,032,891
[45] Date of Patent: Jul. 16, 1991

[54] SEMICONDUCTOR MEMORY DEVICE AND MANUFACTURING METHOD THEREOF

[75] Inventors: Shinichi Takagi, Tokyo; Kenji Natori, Kawasaki; Junji Koga, Yokohama, all of Japan

[73] Assignee: Kabushiki Kaisha Toshiba, Kawasaki, Japan

[21] Appl. No.: 523,413

[22] Filed: May 15, 1990

[30] Foreign Application Priority Data

May 17, 1989 [JP] Japan ................................ 1-123608
Oct. 2, 1989 [JP] Japan ................................ 1-255251

[51] Int. Cl.⁵ .................. H01L 27/02; H01L 29/88; H01L 27/12; G11C 11/34
[52] U.S. Cl. ............................... 357/41; 357/12; 357/4; 357/51; 365/175; 365/176; 365/182
[58] Field of Search ................ 357/41, 12, 51, 4; 365/175, 176, 182

[56] References Cited

U.S. PATENT DOCUMENTS 4,573,143  2/1986  Matsukawa ................ 365/175

FOREIGN PATENT DOCUMENTS 61-41142  9/1986  Japan .

OTHER PUBLICATIONS

Digest of 1982 Symposium on VLSI Technology, pp. 10–11, Sep. 1–3, 1982, by Izumi et al.

*Primary Examiner*—Mark Prenty
*Attorney, Agent, or Firm*—Oblon, Spivak, McClelland, Maier & Neustadt

[57] ABSTRACT

Disclosed is a semiconductor memory device comprising an SOI substrate in which a semiconductor film is formed on a semiconductor substrate with an insulating film interposed therebetween. A memory cell structure is formed by a switching MOS transistor formed in the SOI substrate and an Esaki diode is positioned on the MOS transistor. The memory device also comprises a memory cell provided with a plurality of tunnel diodes connected to one of the impurity regions constituting the FET formed in the semiconductor substrate, and another memory cell provided with an Esaki diode formed in an self-alignment by a solid phase diffusion. In manufacturing the semiconductor memory device, the MOS transistor and the Esaki diode, which collectively form a memory cell, are integratedly formed one upon the other. The MOS transistor is formed in a semiconductor substrate using an SOI structure so as to prepare a memory cell which does not include a parasitic pn-junction.

11 Claims, 13 Drawing Sheets

SEMICONDUCTOR MEMORY DEVICE AND MANUFACTURING METHOD THEREOF

BACKGROUND OF THE INVENTION

1. Field of the Invention

The present invention relates to a semiconductor memory device, particularly, to a static RAM (SRAM) including a diode having negative resistance characteristics.

2. Description of the Related Art

In the ordinary SRAM using MOS transistors, a flip-flop circuit is used as a memory cell. As a result, 4 to 6 MOS transistors are required for every cell, making it difficult to provide an SRAM of high degree of integration, comparing with a DRAM.

On the other hand, Published Examined Japanese Patent Application No. 61-41142 teaches that an SRAM which permits obtaining a bistability by utilizing the negative resistance characteristics of an Esaki diode is adapted for achieving a high degree of integration.

In the conventional SRAM memory cell using an Esaki diode, which is equivalent to that of the present invention, an Esaki diode and a load resistor are connected in series between a high potential power source and a low potential power source. Further, a switching MOS transistor is positioned at the junction between the Esaki diode and the load resistor, said junction acting as a memory node. Two stable points on the L- and H-level sides, which are determined by the current-voltage characteristic curve of the Esaki diode and the load line, are allowed to correspond to the binary information of "0" and "1" so as to achieve a static information recording.

Also known is an SRAM memory cell of an improved construction, in which a second Esaki diode is used in place of the load resistor. In this case, the characteristics of the two Esaki diodes are selected appropriately, making it possible to obtain an SRAM with a very low power dissipation, whether the DC current is in the state of "0" or "1".

Where the SRAM memory cell is formed integrally in a semiconductor substrate, however, the basic construction described above still requires a large memory cell area, compared with a DRAM consisting of a single transistor and a single capacitor. Also, a parasitic pn junction diode is formed in the region of the Esaki diode, resulting in unstable memory characteristics.

On the other hand, Published Examined Japanese Patent Application No. 61-41142 quoted above proposes an SOS structure, in which an Esaki diode is formed within a silicon film formed on a sapphire substrate. However, a switching MOS transistor is not considered in this related art. In the case of the SOS structure, the switching MOS transistor is also formed within the silicon film, quite naturally. As a result, the element isolation is facilitated, making it possible to eliminate the parasitic pn-junction. However, a marked improvement in the degree of integration cannot be expected in the case where a MOS transistor and an Esaki diode are formed in a planar arrangement, comparing with the use of a semiconductor substrate. Also, the MOS transistor formed within a silicon film included in the SOS structure is inferior in characteristics to the MOS transistor formed in a single-crystalline silicon substrate. It follows that difficulty remains unsolved in the memory retention characteristics of the SRAM.

It should also be noted that, in order to enhance the degree of integration, it is important to consider the scaling of the MOS transistor. In addition, it is necessary to diminish the junction area of the Esaki diode. Proposed in Published Examined Japanese Patent Application No. 61-41142 referred to previously is an SOS structure in which an Esaki diode is formed in a silicon film deposited on a sapphire substrate. However, how to form the Esaki diode, which is important, is not specifically described in this prior art.

On the other hand, Published Examined Japanese Patent Application No. 61-240498 discloses a fine memory cell having a cell structure that a tunnel diode is formed by means of epitaxial growth on the drain region. The memory cell disclosed in this prior art is featured in that a resistor exhibiting a linear voltage-current characteristics is used as a load (resistor) of the cell. The use of a resistor in place of a tunnel diode makes it necessary to form a highly resistive polycrystalline silicon film acting as a load in a manner to cover the element isolation film or to be buried in a trench formed in the substrate. The particular structure necessitates a complex manufacturing process, giving rise to the defect that it is difficult to manufacture the memory cell. If a load is used simply as a resistor, it is necessary to control the resistance value strictly in order to obtain a stable cell operation, giving rise to a big problem to be solved in the manufacturing process.

An SRAM which uses an Esaki diode attracts attentions as a memory which provides a high degree of integration. However, the degree of integration achieved to date is not sufficient. Also, the semiconductor memory device including the SRAM fails to exhibit stable memory characteristics.

Further, it is difficult to obtain satisfactory negative resistance characteristics with the conventional process for manufacturing an Esaki diode. In addition, there still be many problems unsolved with respect to the conventional process for forming an Esaki diode.

SUMMARY OF THE INVENTION

An object of the present invention is to provide an SRAM including an Esaki diode, which permits overcoming the above-noted problems inherent in the prior art so as to achieve a high degree of integration.

The SRAM of the present invention utilizes an SOI substrate in which a semiconductor film is formed on a semiconductor substrate with an insulating film interposed therebetween. A switching MOS transistor is formed in the semiconductor substrate, and an Esaki diode is formed on the semiconductor film formed on the substrate so as to form a memory cell structure.

Also, the SRAM comprises a memory cell including a tunnel diode connected to one of the impurity regions of the MOS transistor formed in the semiconductor substrate.

Further, the SRAM of the present invention comprises a memory cell including an Esaki diode formed by self-alignment using a solid phase diffusion.

In the manufacturing method of the present invention, a MOS transistor and an Esaki diode, which collectively form a memory cell, are formed integratedly one upon the other, making it possible to markedly diminish the area occupied by the memory cell. Also, the use of the SOI structure facilitates the element separation, making it possible to manufacture a memory cell which does not include a parasitic pn junction. In addition, since the MOS transistor is formed within the substrate, it is possible to provide a semiconductor memory device exhibiting excellent characteristics, e.g., a memory device having stable memory characteristics.

In the memory device of the present invention, two tunnel diodes are joined to each other over an FET constituting a memory cell. The particular construction makes it possible diminish the entire memory cell area so as to provide a memory cell which stably exhibits satisfactory characteristics.

What should also be noted is that the Esaki diode is formed by self-alignment using a solid phase diffusion in the present invention, leading to a diminished area occupied by the memory cell including the Esaki diode. It is also possible to diminish the pn junction area, leading to a memory which exhibits stable characteristics with a small power consumption.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
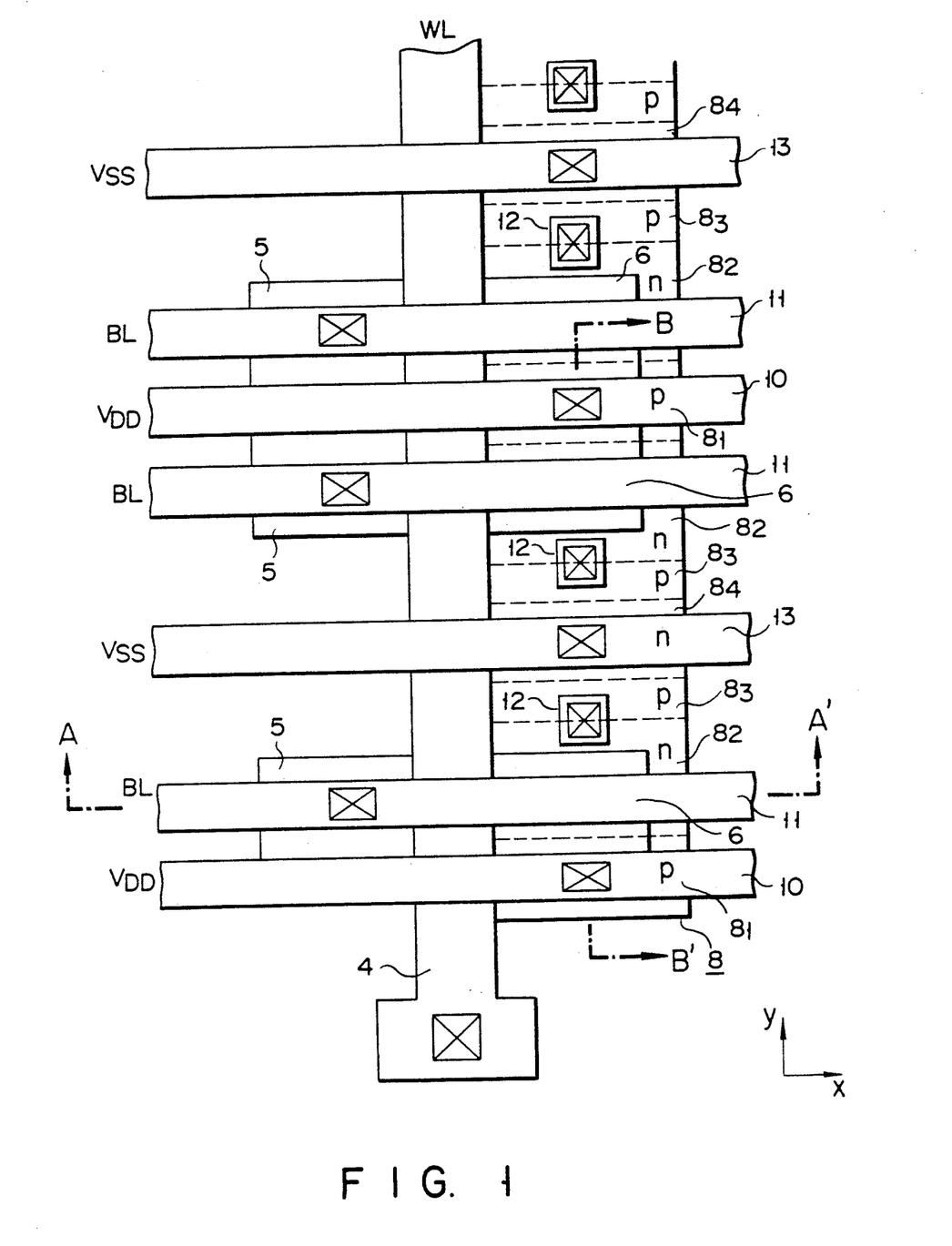
FIG. 1 is a plan view showing a memory cell of a static RAM (SRAM) according to the first embodiment of the present invention.
Figure 2A:
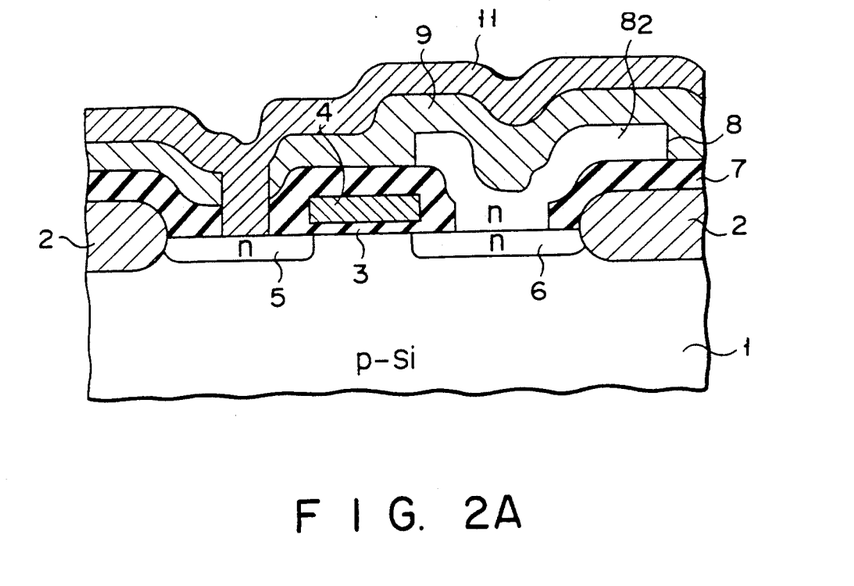
FIG. 2A is a cross sectional view of the SRAM along the line A—A' shown in FIG. 1.
Figure 2B:
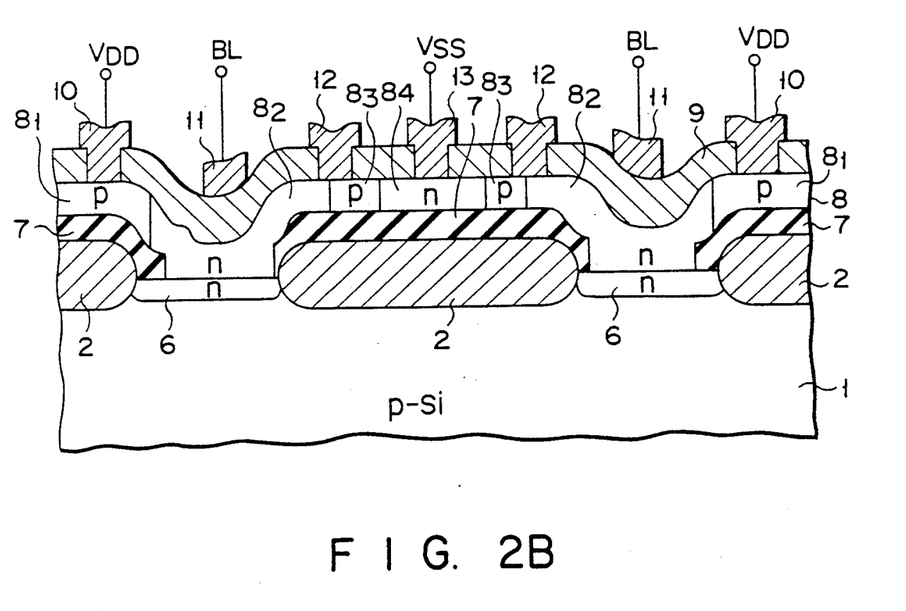
FIG. 2B is a cross sectional view of the SRAM along the line B—B' shown in FIG. 1.
Figure 3:
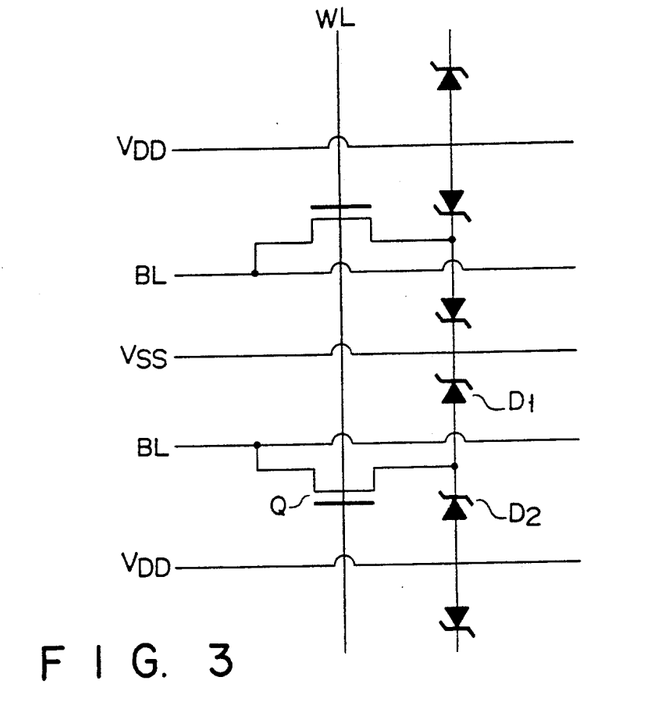
FIG. 3 is an equivalent circuit diagram of the memory cell array shown in FIG. 1.

FIG. 1 is a plan view of a memory cell array according to the first embodiment of the present invention. The cross sections along the lines A—A' and B—B' shown in FIG. 1 are shown in FIGS. 2A and 2B, respectively. Further, FIG. 3 is an equivalent circuit diagram of the memory cell array shown in FIG. 1. As seen from FIG. 3, each memory cell is formed of first and second Esaki diodes D1, D2 and a MOS transistor Q.

FIG. 2A shows that a gate electrode 4 is formed above that region of a p-type silicon substrate 1 which is surrounded by an element isolating insulation film 2. A gate insulation film 3 is interposed between the gate electrode 4 and the substrate 1. Also, an n-type source region 5 and an n-type drain region 6 are formed by self-alignment using the gate electrode 4 as a mask so as to form a MOS transistor Q within the substrate region. As seen from FIG. 1, the gate electrode 4 is consecutively formed in a direction denoted by an arrow y over a plurality of MOS transistors and acts as a word line (WL). The substrate having the MOS transistor formed therein is covered with an insulating film 7, and the insulating film 7 is covered with a silicon film 8. The silicon film 8 is in contact with the silicon substrate 1 via an opening formed in the insulating film above the drain region 6. Crystallization proceeds from the contact portion between the film 8 and the substrate 1, with the result that the film 8 is converted into a high quality crystalline silicon film. As seen from FIG. 1, the silicon film 8 is formed in a band-like pattern extending in parallel with the gate electrode 4.

As shown in FIG. 2B, the silicon film 8 is doped with impurities so as to form p-type regions $8_1$, $8_3$ and n-type regions $8_2$, $8_4$. These p- and n-type regions $8_1$ to $8_4$ are alternately arranged, i.e., alternate in the direction parallel with the extending direction of the gate electrode 4 so as to form pn junctions extending in a direction perpendicular to the extending of the gate electrode 4. The second Esaki diode $D_2$ is formed by the p-type region $8_1$ and the n-type region $8_2$. It should noted that the p-type region $8_1$ also acts as a member included in an adjacent memory cell. Likewise, the n-type region $8_4$ included in a first Esaki diode $D_1$ also acts as a member included in an adjacent memory cell. In this fashion, a row of Esaki diodes is formed in the silicon film 8.

The n-type region $8_2$ of the second Esaki diode $D_2$ is formed to overlap with the position of an opening formed in the insulating film 7 and to be connected to the drain region 6 of the MOS transistor Q. Also, an interlayer insulation film 9 is formed to cover the row of the Esaki diodes. Further, a metal wiring 11 is formed on the interlayer insulation film 9. As seen from FIG. 1, each of a power source line ($V_{DD}$ line) 10 on a high potential side, which is connected to the p-type region $8_1$ of the second Esaki diode $D_2$, a bit line (BL), which is connected to the source region 5 of the MOS transistor, and a power source line ($V_{SS}$ line) 13 on a low potential side, which is connected to the n-type region $8_4$ of the first Esaki diode $D_1$, is consecutively formed to extend in a direction denoted by an arrow x, which is perpendicular to the extending direction of the gate electrode 4. Also, a short circuiting electrode 12 serving to achieve a short circuiting between the n-type region $8_2$ of the first Esaki diode $D_1$ and the p-type region $8_3$ of the second Esaki diode $D_2$ is formed simultaneously with the formation of the metal wiring layer. The short circuiting electrode 12 is formed at the connecting portion between the first and second Esaki diodes $D_1$ and $D_2$, said connecting portion acting as a memory node for each memory cell. In this fashion, a plurality of memory cells are arranged along the word line, i.e., in the direction denoted by the arrow y, such that the $V_{DD}$ line 10 and the $V_{SS}$ line 13 are commonly used by a plurality of adjacent memory cells.

FIGS. 4A to 4E and FIGS. 5A to 5E are cross sectional views of the cell structure in the specific manufacturing steps of the memory cell. To be more specific, FIGS. 4A to 4E show the cross sections of the memory cell along the line A—A' shown in FIG. 1. On the other hand, FIGS. 5A to 5E show the cross sections of the memory cell along the line B—B' shown in FIG. 1.

A memory cell is manufactured in the present invention by the manufacturing steps described below.

(A) In the first step, the element isolating insulation film 2 is formed on the surface of the silicon substrate 1, as in the ordinary manufacturing process of a MOS integrated circuit. Then, a gate insulating film is formed on the substrate 1 and the insulating film 2 by means of thermal oxidation, followed by patterning the thermal oxide film and subsequently forming the gate electrode 4. After formation of the gate electrode 4, an impurity is introduced into the substrate 1 by means of ion implantation using the gate electrode 4 as a mask so as to form the source region 5 and the drain region 6 (see FIGS. 4A and 5A).

Figure 4A:
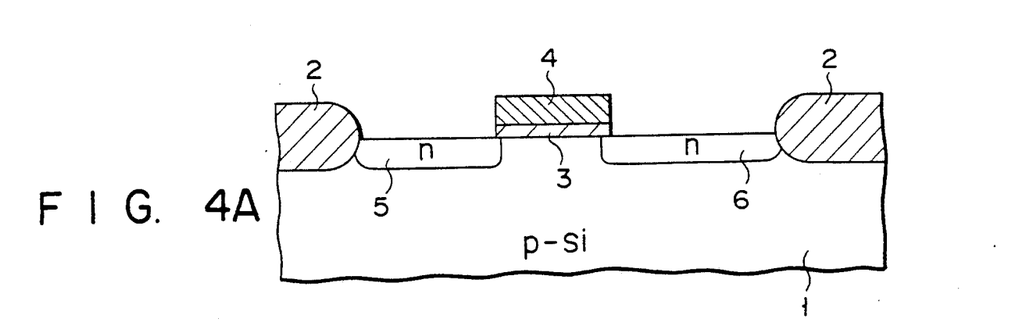
FIGS. 4A to 4E are cross sectional views, which correspond to the cross section shown in FIG. 2A, collectively showing the steps for manufacturing the memory cell array shown in FIG. 1.
Figure 4B:
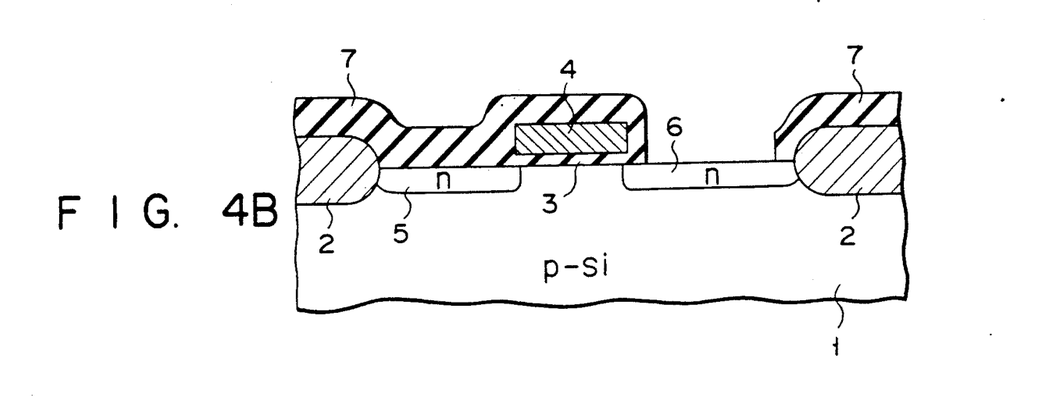
Figure 4C:
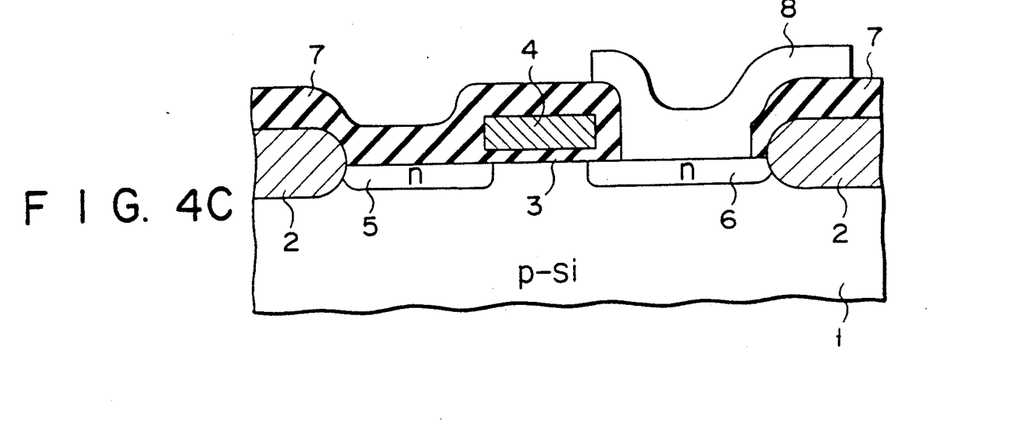
Figure 4D:
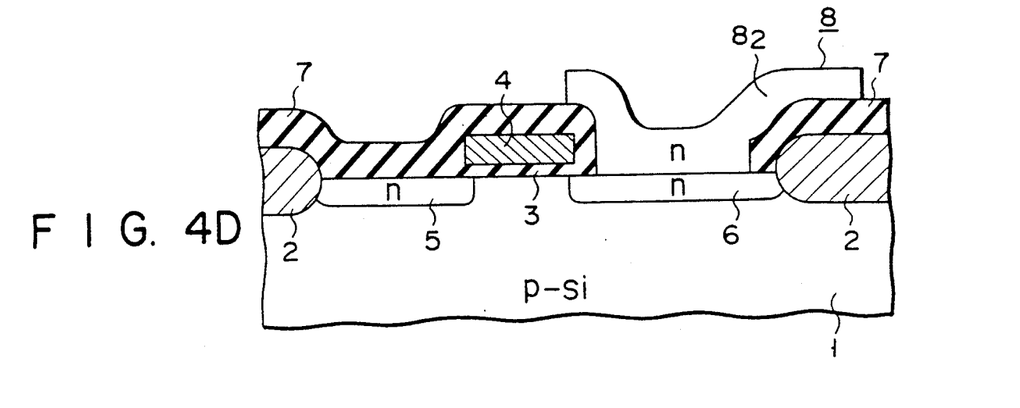
Figure 5A:
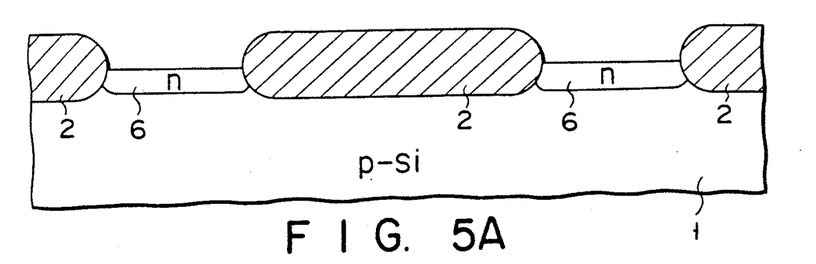
FIGS. 5A to 5E are cross sectional views, which correspond to the cross section shown in FIG. 2B, collectively showing the steps for manufacturing the memory cell array shown in FIG. 1.
Figure 5B:
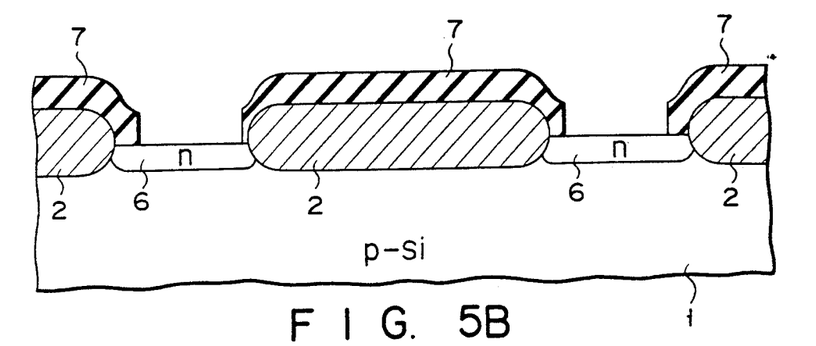

(B) In the next step, an insulating film 7 such as a silicon dioxide film is formed on the resultant structure by means of CVD (Chemical Vapor Deposition) method, followed by forming an opening in the insulating film 7 so as to expose the drain region 6 of the MOS transistor (see FIGS. 4B and 5B).

(C) Then, a polycrystalline silicon film is deposited by CVD method on the entire surface, followed by patterning the polycrystalline silicon film. After the patterning step, a recrystallization treatment, e.g., a solid phase epitaxial growth, is applied using as a seed the contact portion between the polycrystalline silicon film and the substrate surface. As a result, single-crystalline silicon film 8 is formed on the substrate 1 (see FIGS. 4C and 5C).

(D) After formation of the silicon film 8, a high concentration of phosphorus or arsenic is introduced into the entire region of the silicon film 8 by means of ion implantation so as to permit the silicon film 8 to be of n-type. Then, a resist pattern is formed on the silicon film 8, followed by selectively introducing a high concentration of boron into the silicon film 8 by means of ion implantation using the resist pattern as a mask. As a result, the silicon film 8 is selectively permitted to be of p-type so as to form a row of Esaki diodes within the silicon film 8, each diode having a pn junction extending in the lateral direction (see FIGS. 4D and 5D).

Figure 4E:
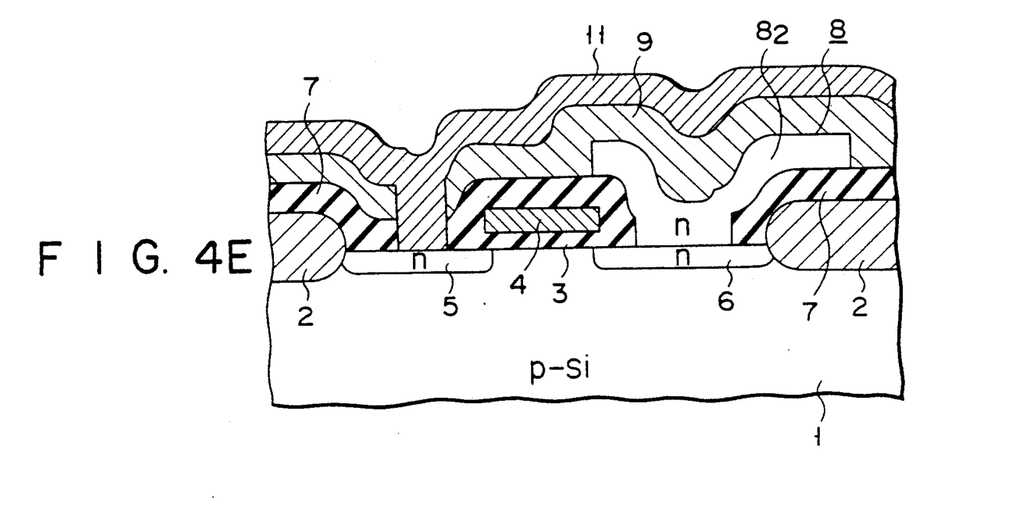

(E) Finally, an insulating film 9 is formed on the entire surface by CVD method, followed by forming contact holes in the insulating film 9 and subsequently depositing an aluminum film and patterning the deposited aluminum film so as to form a $V_{DD}$ line 10, a bit line 11, a short circuiting electrode 12 and a $V_{SS}$ line 13 (see FIGS. 4E and 5E).

Figure 6:
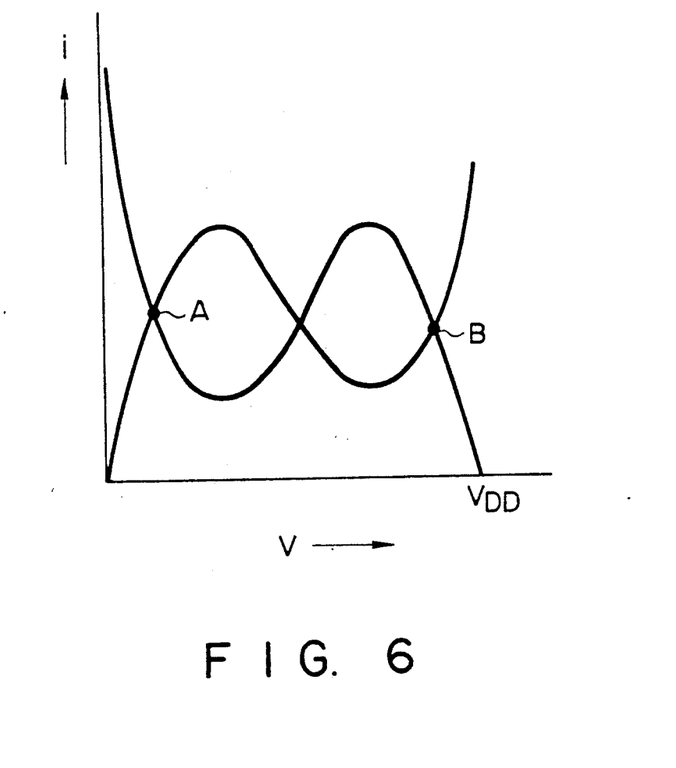
FIG. 6 shows voltage-current characteristics used for describing the electric operation of the memory cell array shown in FIG. 1.

The SRAM memory cell thus prepared is operated as follows. It should be noted that FIG. 6 shows the voltage-current characteristic curves at the portions of the two Esaki diodes $D_1$ and $D_2$ connected in series between $V_{DD}$ and $V_{SS}$. Information is recorded such that two stable points A and B on the characteristic curves correspond to binary information 37 0" and "1". To be more specific, $V_{DD}$ is set at, for example, 1 V, with $V_{SS}$ set at 0 V. In this case, the memory node potential is about 0.2 V under the state of "0" and about 0.8 under the state of "1". Where "1" is written, H-level is given to the word line so as to turn the MOS transistor Q on. Also, H-level is given to the bit line so as to sufficiently bias the first Esaki diode $D_1$ in the forward direction. Then, the MOS transistor Q is turned off. In the case of writing "0", H-level is given to the word line so as to turn the MOS transistor Q on. Also, 0 V is imparted to the bit line so as to sufficiently bias the second Esaki diode $D_2$ in the forward direction. In the case of reading out data, the bit line is precharged to a level intermediate between "1" and "0". Under this condition, the switching MOS transistor Q is turned on. If the data is "0", the potential of the bit line is lowered. On the other hand, if the data is "1", the potential of the bit line is elevated. The data is read out by detecting the change in the potential of the bit line by a sense amplifier connected to the bit line.

It should be noted that an SOI substrate is used in the embodiment described above. A MOS transistor is formed on the side of the substrate, and an Esaki diode is formed within a silicon film. The SRAM of the particular construction permits markedly diminishing the area occupied by the cell and exhibits excellent characteristics.

Figure 7:
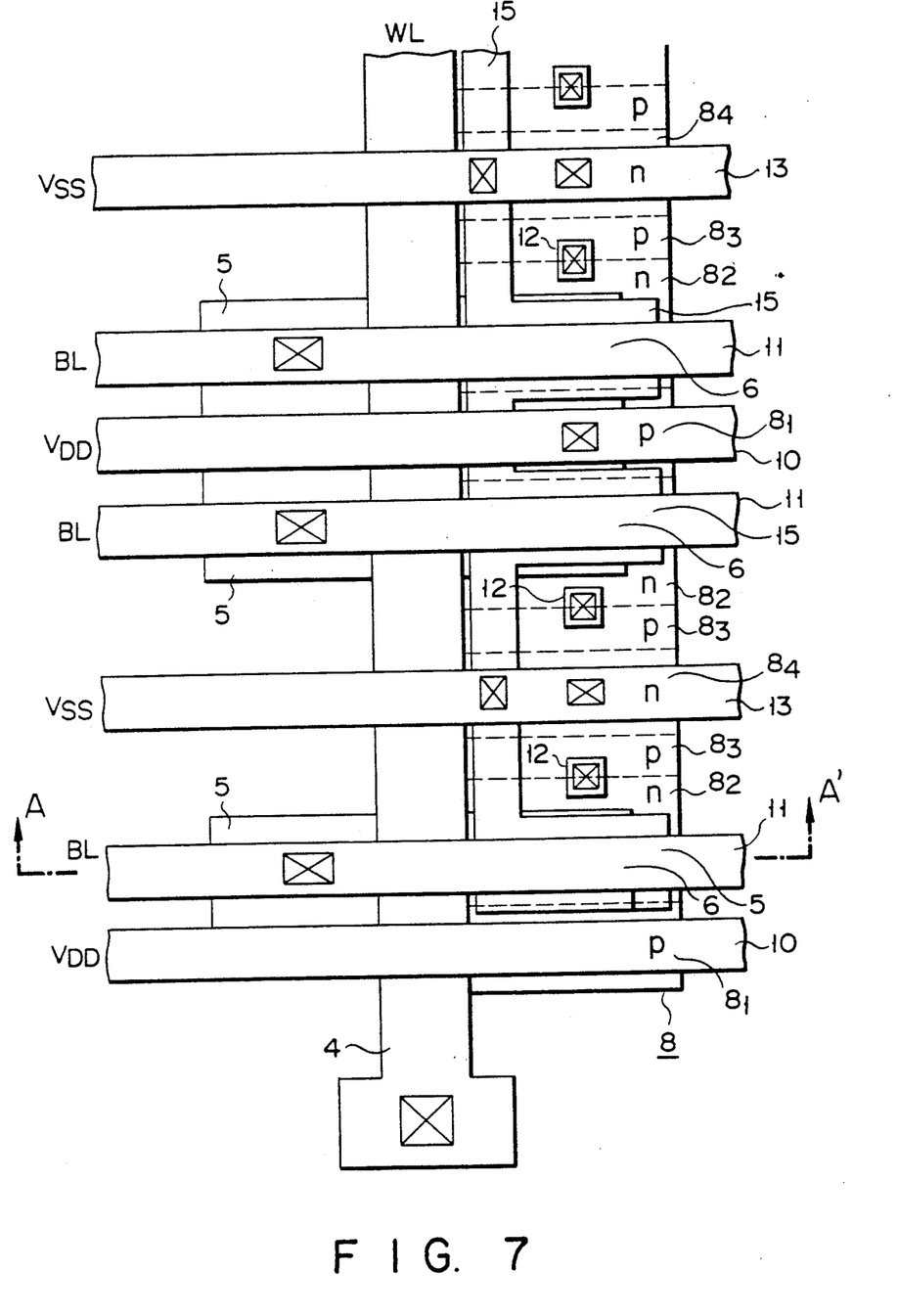
FIG. 7 is a plan view showing a memory cell array of a SRAM according to the second embodiment of the present invention.
Figure 8:
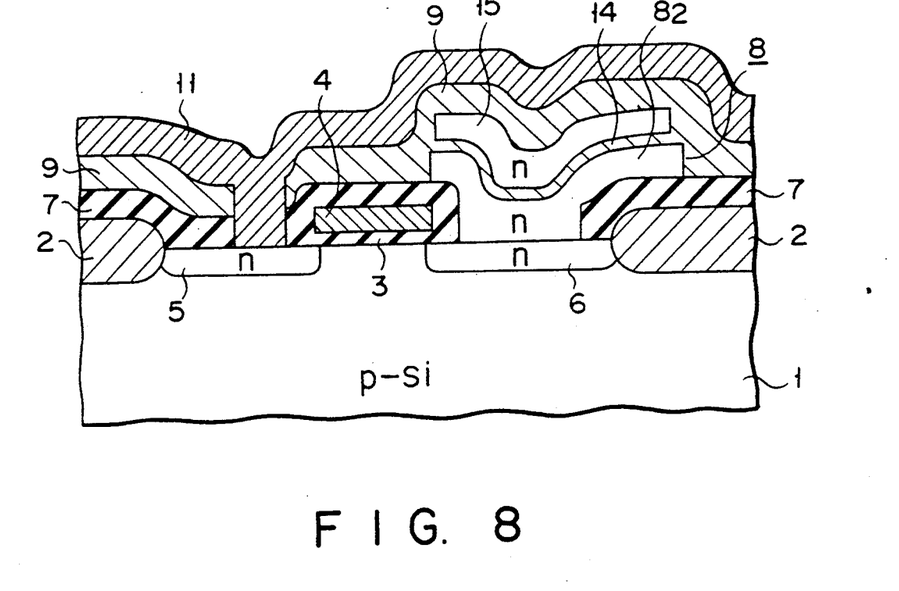
FIG. 8 is a cross sectional view of the SRAM along the line A—A' shown in FIG. 7.
Figure 9:
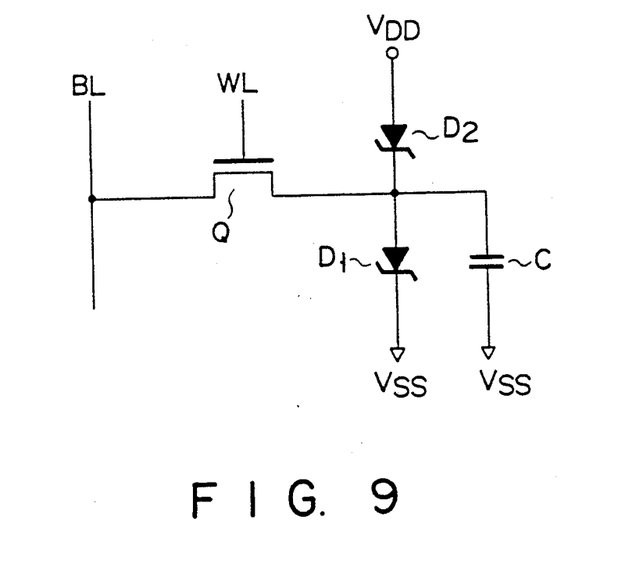
FIG. 9 is an equivalent circuit diagram showing the memory cell array of the SRAM shown in FIG. 7.

FIG. 7 is a plan view showing an SRAM memory cell array according to another embodiment of the present invention. FIG. 8 is a cross sectional view along the line A—A' shown in FIG. 7. The reference numerals common with those used in the embodiment described previously denote the same members of the device and, thus, the description thereof is omitted. The embodiment shown in FIGS. 7 and 8 is substantially the same as the embodiment shown in FIGS. 1 and 2, except that, in the embodiment of FIGS. 7 and 8, a capacitor electrode 15 is formed over the region $8_2$ of the silicon film 8, said region $8_2$ being used as a memory node. As seen from FIG. 8, a capacitor insulation film 14 interposed between the silicon film 8 and the capacitor electrode 15. As shown in FIG. 7, the capacitor electrode 15 is consecutively formed in a plurality of memory cells so as to be connected to the $V_{SS}$ line 13. FIG. 9 is an equivalent circuit diagram of the memory cell array shown in FIGS. 7 and 8. In this embodiment, a capacitor C is connected to a memory node N. In this embodiment, the capacitance of the memory node is increased, with the result that it is possible to suppress the change in the operating point of the cell, which is caused by the potential difference between the bit line and the memory node when the MOS transistor Q is turned on. It follows that it is possible to prevent the information from being destructed, making it possible to achieve a stable sense operation even where the bit line has a large capacitance.

In each of the embodiments described above, two Esaki diodes are connected in series. However, it is possible to apply the technical idea of the present invention to an SRAM which uses a load resistor as shown in FIGS. 10A to 10D.

Let us describe a method of forming an Esaki diode used in the memory cell according to another embodiment of the present invention. Specifically, FIGS. 10A to 10D are cross sectional views, along the line B—B' shown in FIG. 1, of an SRAM including Esaki diodes prepared by using a solid phase diffusion source.

Figure 5C:
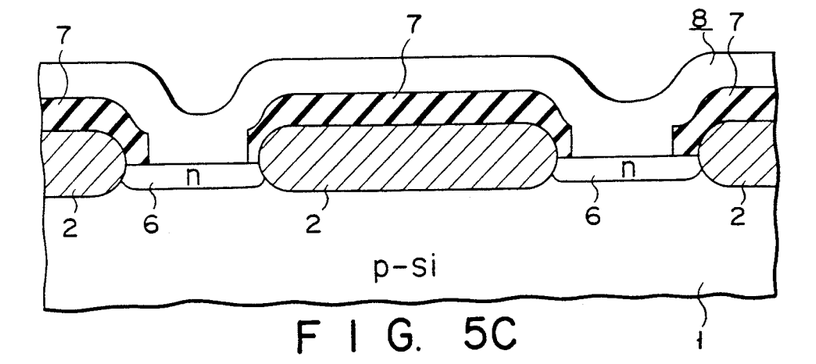
Figure 5D:
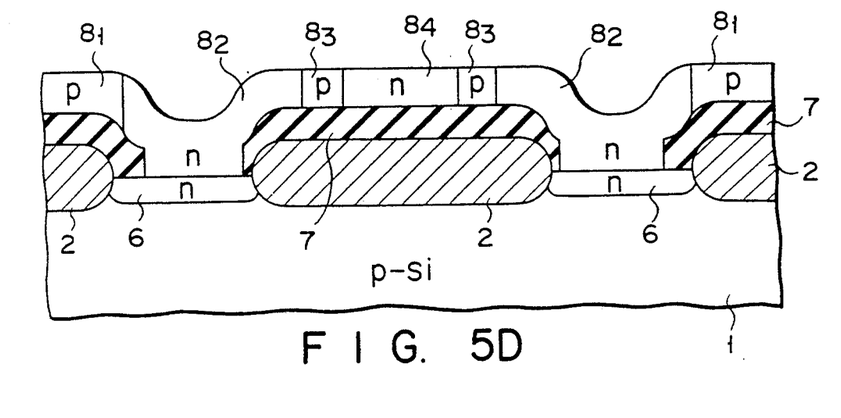
Figure 5E:
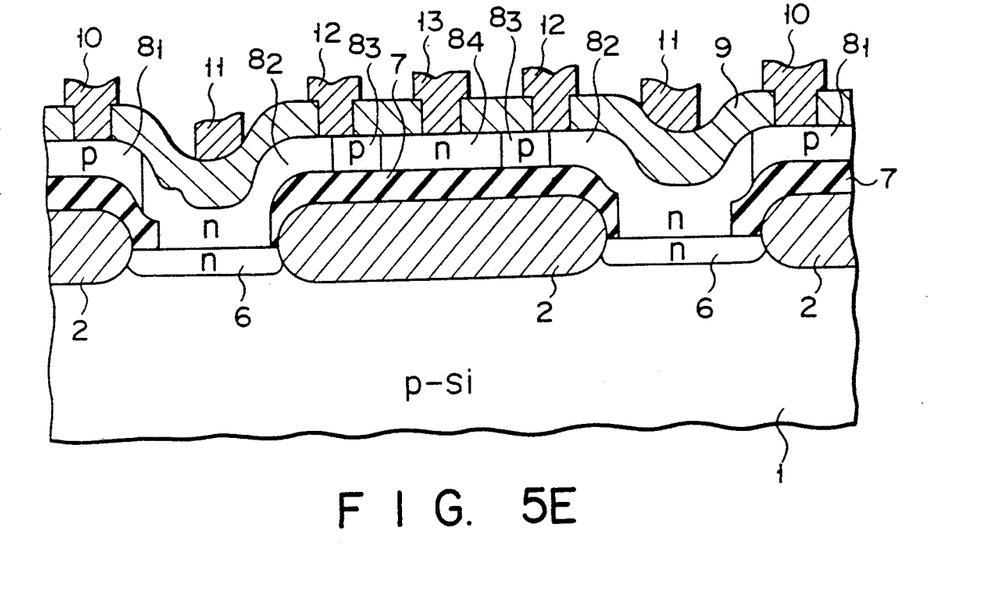

(A) In the first step, a polycrystalline silicon film 100 is deposited on the structure shown in FIG. 5C, followed by introducing boron by ion implantation into the polycrystalline silicon film 100 at a does of about $10^{15}$ cm$^{-2}$. The ion implantation is carried out with an implanting energy of 30 to 60 KeV (see FIG. 10A).

Figure 10A:
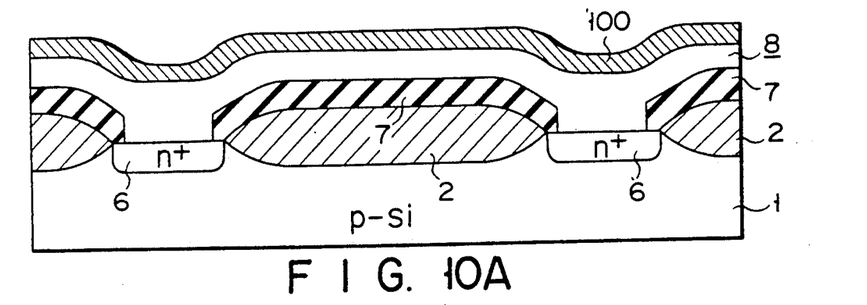
FIGS. 10A to 10D are cross sectional views collectively showing the steps for manufacturing an SRAM according to the third embodiment of the present invention, in which a solid phase diffusion source is used for forming an Esaki diode.
Figure 10B:
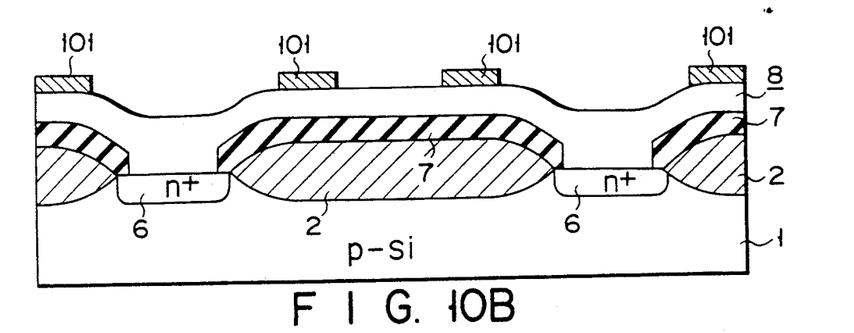
Figure 10C:
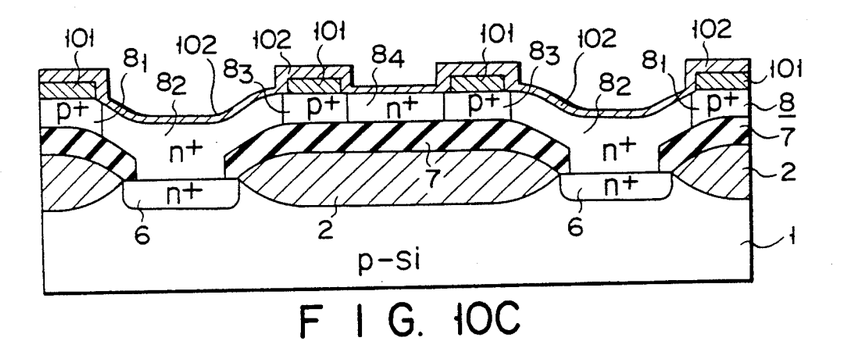

(B) Then, the polycrystalline silicon film 100 is patterned such that polycrystalline silicon regions 101, which are allowed to act later as p-type regions of Esaki diodes, are left unremoved (see FIG. 10B).

(C) After the patterning step, the entire surface is oxidized so as to form an oxide film 102. It should be noted that the oxide growth rate of the polycrystalline silicon is about two times as high as that of the single-crystalline silicon, with the result that the oxide film formed on the polycrystalline silicon film is about two times as thick as that formed on the single-crystalline silicon film. It is generally desirable to set the thickness of the oxide film formed on the poly-crystalline silicon film at about 500 Å or less, though the value differs depending on the specific process employed. After formation of the oxide film 102, arsenic or phosphorus is introduced into the silicon film 8 by means of ion implantation at a does of about $10^{15}$ cm$^{-2}$ and under an implanting energy of 30 to 60 KoV. Then, a heat treatment is applied so as to form n-type regions $8_2$, $8_4$ and p-type regions $8_1$, $8_3$. These n-type and p-type regions have a high impurity concentration. It should be noted that the p-type regions $8_1$ and $8_3$ are formed by a solid phase diffusion of an impurity from the polycrystalline silicon portions 101 (see FIG. 10C).

Figure 10D:
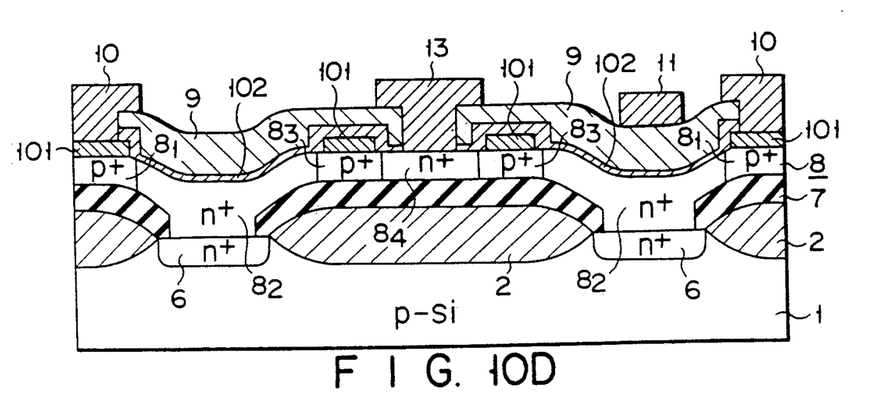

(D) Finally, an insulating film 9 is deposited on the entire surface by CVD, followed by forming contact holes in the insulating film and subsequently depositing an aluminum film and patterning said aluminum film so as to form the $V_{DD}$ line 10, the bit line 11 and the $V_{SS}$ line 13 (see FIG. 10D).

In the manufacturing method described above, a high concentration of the p-type impurity and a high concentration of the n-type impurity do not compensate each other in the step of forming the pn junction of the Esaki diode, making it possible to form an Esaki diode having excellent electrical characteristics.

In the embodiment described above, the particular manufacturing method is applied to the formation of an Esaki diode on an SOI structure. However, it is also possible to employ the particular method for manufacturing an SRAM having an Esaki diode formed within the substrate. FIGS. 11A to 11F collectively show a method for manufacturing the particular SRAM. Specifically, FIGS. 11A to 11F are cross sectional views collectively showing the steps of manufacturing an SRAM including Esaki diodes formed by the method of the present invention, (A) In the first step, p-type regions 28 are formed in an n-type silicon substrate 21, followed by forming an element separating insulation film 22, by the method similar to that employed in the manufacturing process of the ordinary MOS integrated circuit (see FIG. 11A).

(B) Then, a polycrystalline silicon film doped with such a high concentration of arsenic or phosphorus as about $10^{20}$ cm$^{-3}$ is formed on the entire surface, followed by patterning the polycrystalline silicon film so as to form polycrystalline silicon portions 23. These polycrystalline silicon portions are formed by the method used in the embodiment shown in FIG. 10B (see FIG. 11B).

(C) After formation of the polycrystalline silicon films 23, the entire surface is oxidized to form an oxide film 27. The oxidizing treatment is continued until the gate oxide film of a MOS transistor, which is formed later, is formed on the surface of the substrate 21 (see FIG. 11C).

Figure 11A:
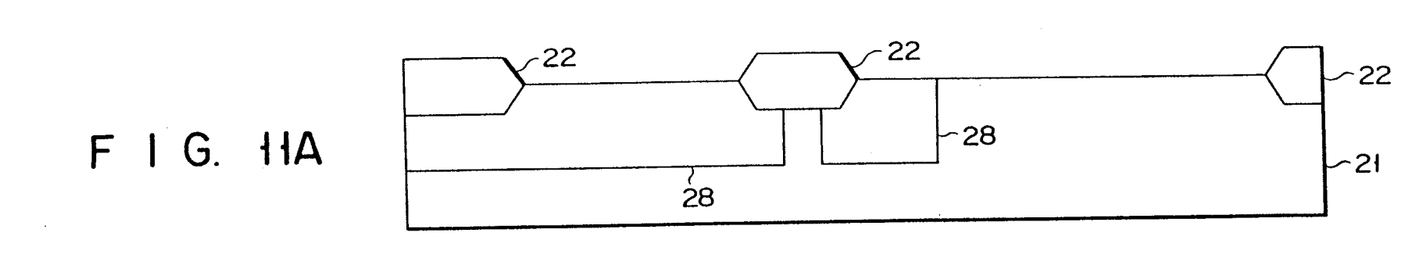
FIGS. 11A to 11F are cross sectional views collectively showing the steps for manufacturing an SRAM according to the fourth embodiment of the present invention, in which an epitaxial growth is employed for forming a vertical type Esaki diode.
Figure 11B:
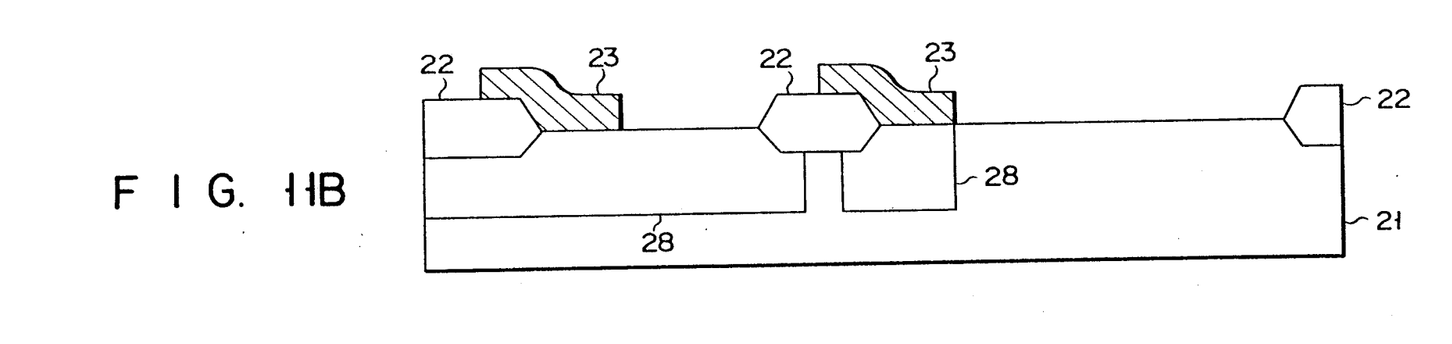
Figure 11C:
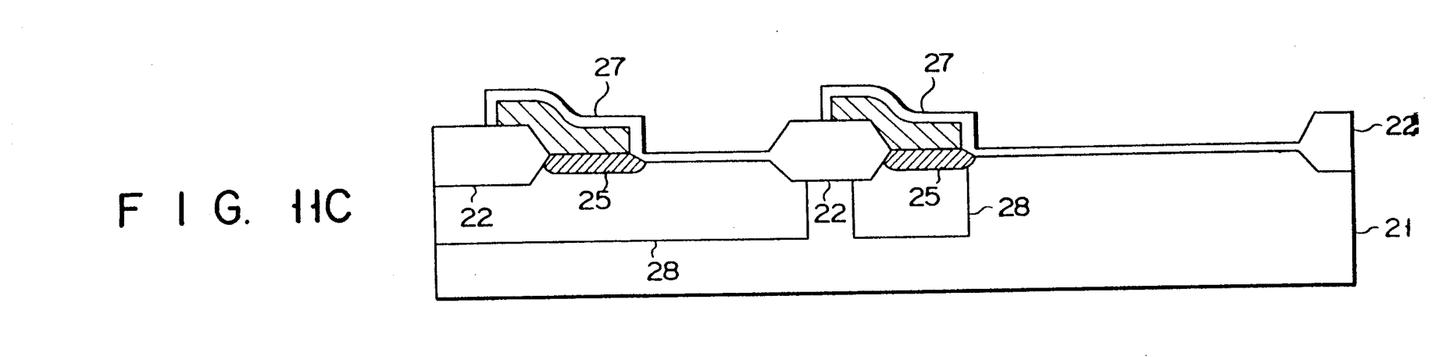
Figure 11D:
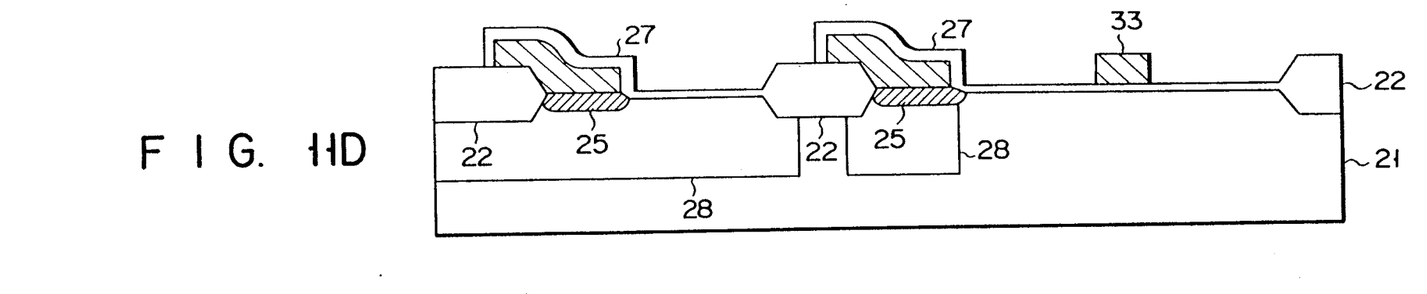

(D) In the next step, a gate electrode 33 for a p-channel MOS transistor is selectively formed on the oxide film 27, as in the manufacturing process of the ordinary p-channel MOS transistor (see FIG. 11D).

(E) Further, boron ions are injected at a high concentration the silicon substrate 21 under the ion implantation conditions described previously so as to form a source region 29, and a drain region 30 of the p-channel MOS transistor as well as a p-type impurity region 24 having a high impurity concentration of an Esaki diode within the substrate 21. The drain region 30 noted above also acts as a p-type impurity region of the Esaki diode having a high impurity concentration. It should be noted that, during the thermal oxidation treatment described above, the impurity within the polycrystalline silicon film 23 is introduced into the p-type region 28 so as to form an n-type impurity region 25 having a high impurity concentration within the p-type region 28, with the result that an Esaki diode is formed by the p-type region 28 and the n-type region 25 (see FIG. 11E).

Figure 11E:
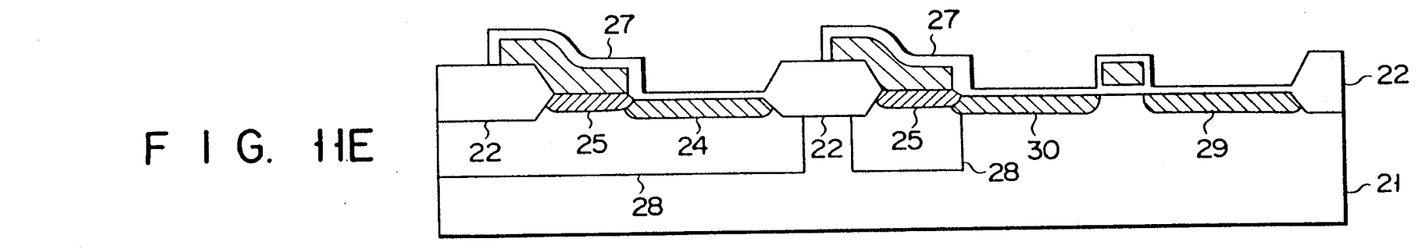
Figure 11F:
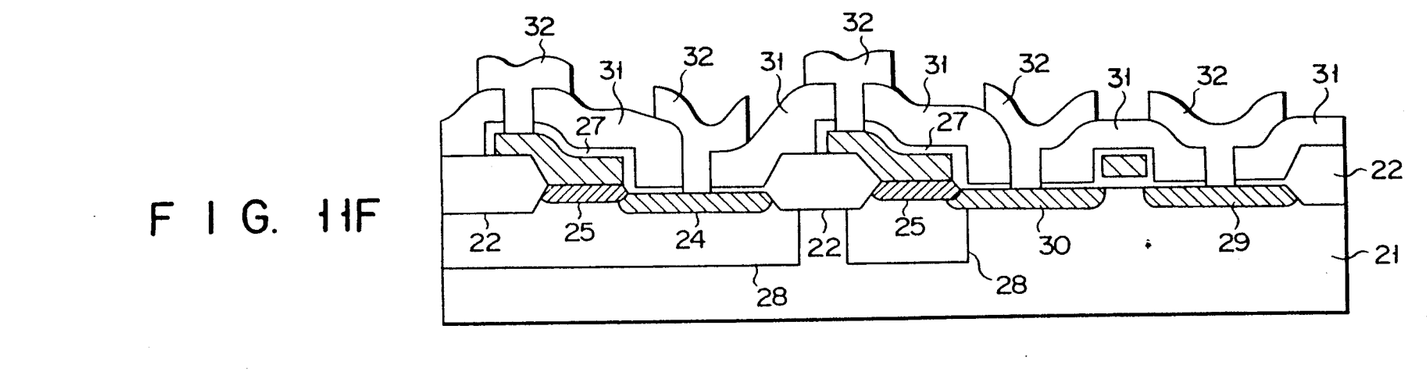

(F) Finally, an interlayer insulation film 31 is formed on the entire surface, followed by forming contact holes in the insulation film 31 and subsequently forming metal wirings $32_1$ to $32_4$ acting as electrodes in a manner to fill the contact holes noted above so as to form a cell structure of an SRAM using an Esaki diode, as shown in FIG. 11F.

It should be noted that a short circuiting between the electrodes $32_1$ and $32_1'$ is achieved in a transverse direction. Also, the electrode $32_2$ is connected to the high potential power source line ($V_{DD}$ line). Likewise, the electrode $32_3$ is connected to the low potential power source line ($V_{SS}$ line). Further, the electrode $32_4$ is connected to bit line (BL). It should also be noted that the gate electrode 33 of the MOS transistor acts as a word line (WL). It follows that the SRAM cell of the construction shown in FIG. 11E is equivalent to the circuit shown in FIG. 9.

FIGS. 12A to 12D are cross sectional views along the line B—B' shown in FIG. 1, showing an SRAM obtained by one embodiment of a method of the present invention for manufacturing a vertical Esaki diode using an epitaxial growth.

Figure 12A:
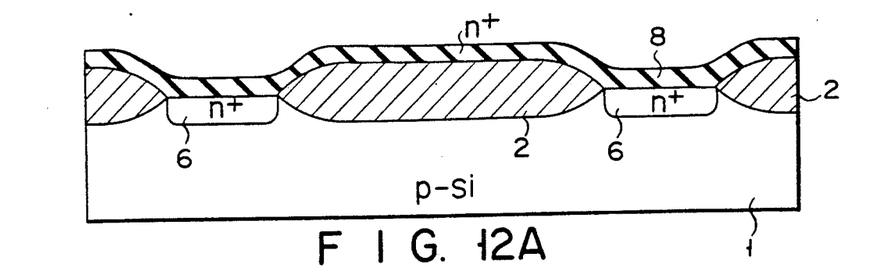
FIGS. 12A to 12D are cross sectional views collectively showing a method of manufacturing an SRAM according to the fifth embodiment of the present invention, in which an Esaki diode is formed in a vertical type using an epitaxial growth.
Figure 12B:
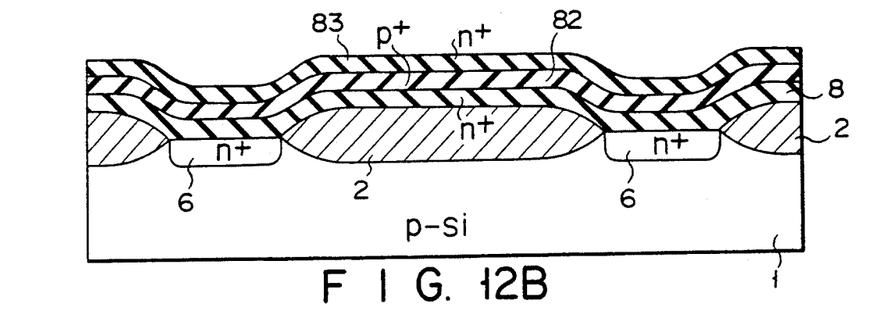

(A) In the first step, arsenic or phosphorus ions are introduced at a high concentration into the entire region of the silicon film included in the structure shown in FIG. 5C so as to convert the silicon film 8 into n-conductivity type, as shown in FIG. 12A.

(B) In the next step, a p-type silicon thin film 82 having such a high impurity concentration as about $10^{20}$ cm$^{-3}$ and an n-type silicon thin film 83 having such a high impurity concentration as about $10^{20}$ cm$^{-3}$ are formed in a thickness of about 2,000 Å successively on the silicon film 8 by means of a photo epitaxial method under a substrate temperature of about 650° C. and a gas pressure of about $8 \times 10^{-7}$ Torr. For the growth of the p-type silicon thin film, monosilane (SiH$_4$) and diborane (B$_2$H$_6$) are used as raw materials. On the other hand, monosilane and phosphine (PH$_3$) are used as raw materials for the growth of the n-type silicon thin film. As a result, a pn junction is formed so as to provide an Esaki diode exhibiting good negative resistance characteristics with a high stability (see FIG. 12B).

Figure 12C:
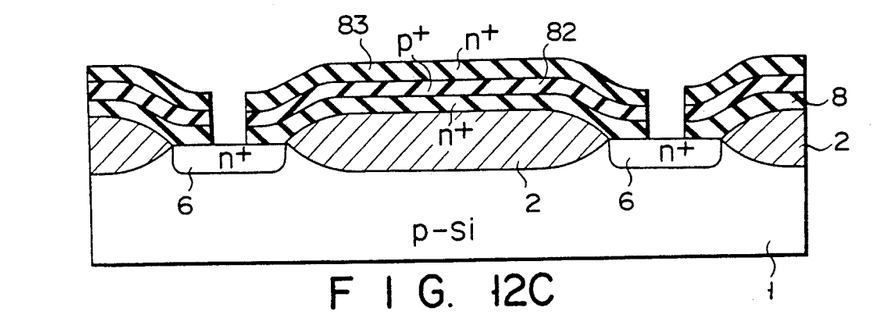

(C) Further, a resist film is formed and, then, patterned so as to provide an opening in that portion of the resist film which is positioned above the drain region 6 formed in the substrate. After the patterning step, a reactive ion etching (RIE) treatment is applied using the resultant resist pattern as a mask so as to selectively etch the p-type silicon thin film 82 and the n-type silicon thin film 83, as shown in FIG. 12C.

Figure 12D:
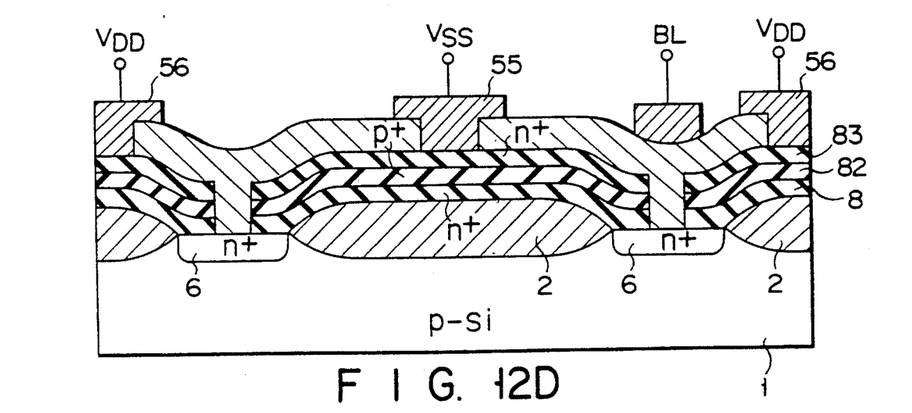

(D) Finally, an insulating film is deposited on the entire surface by means of CVD method, followed by forming contact holes in the insulation film. Further, an aluminum film is formed on the entire surface in a manner to fill the contact holes, followed by patterning the aluminum film so as to form a high potential power source line (V$_{DD}$ line) 56, a bit line (BL) and a low potential power source line (V$_{SS}$ line) 55, as shown in FIG. 12D.

In the manufacturing method described above, the Esaki diode is formed in the vertical direction, making it possible to diminish the area of the element. Further, since an epitaxial growth method is employed for forming the Esaki diode, it is possible to prepare an Esaki diode which does not have a defect level in the vicinity of the pn junction and, thus, which exhibits good electrical characteristics. It should be noted that the application of the particular construction shown in the drawings is not restricted to an Esaki diode formed in an SOI structure. Also, the application of the particular method is not restricted to the preparation of the Esaki diode noted above. To be more specific, the particular construction and method of the present invention can be employed for the preparation of an SRAM in which an Esaki diode is formed directly on a substrate without using an intervening insulation film.

Figure 13:
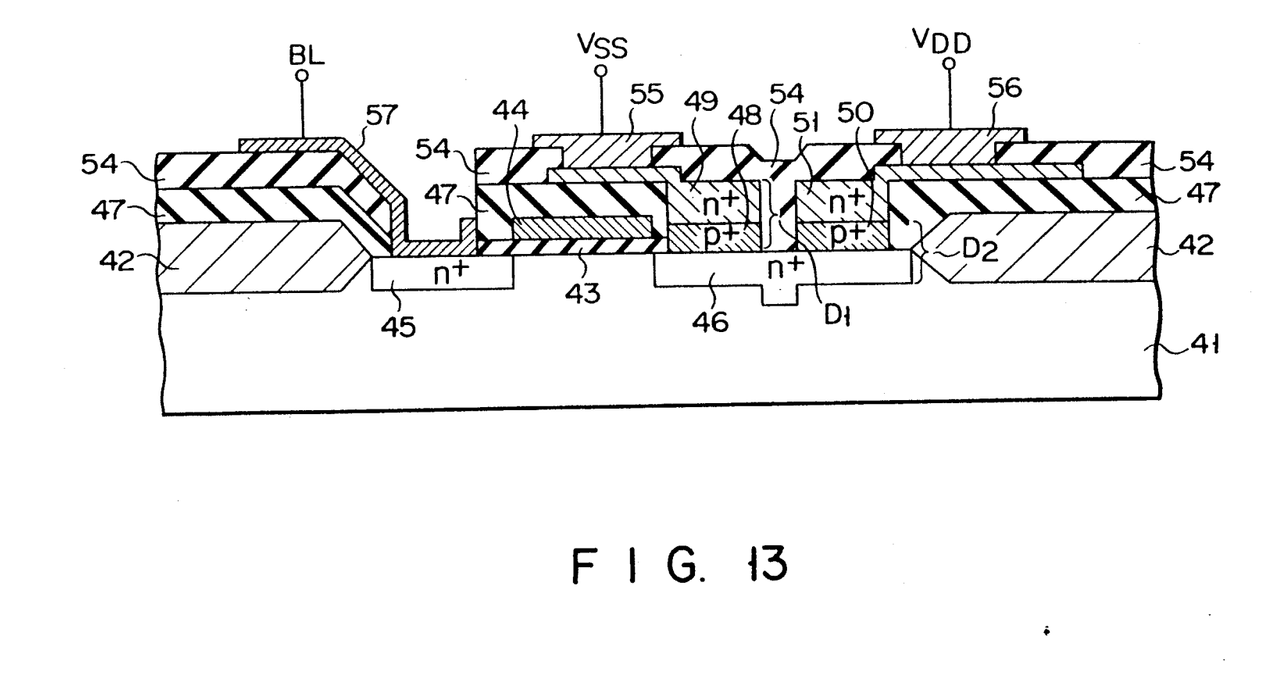
FIG. 13 is a cross sectional view showing an SRAM cell which uses an Esaki diode according to the fifth embodiment of the present invention.

FIG. 13, which covers the construction of the case noted above, is a cross sectional view along the line A—A' shown in FIG. 1. As seen from FIG. 13, a gate electrode 44 is formed within that portion of a p-type silicon substrate 41 which is surrounded by an element separating insulating film 42. A gate insulating film 43 is interposed between the substrate 41 and the gate electrode 44. Further, an n-type source region 45 and an n-type drain 46 each having a high impurity concentration are formed so as to provide a MOS transistor Q. These source and drain regions 45 and 46 are self-aligned by the gate electrode 44.

The substrate 41 having the MOS transistor Q formed therein is covered with the first insulating film 47. It is seen that the first insulating film 47 is selectively removed so as to expose the drain region 46. It is also seen that a p-type silicon thin film 48 having a high impurity concentration, an n-type silicon thin film 49 having a high impurity concentration, a p-type silicon thin film 50 having a high impurity concentration and an n-type silicon thin film 51 having a high impurity concentration are formed in the exposed portion noted above. It should be noted that the p-type silicon thin films 48 and 50 each having a high impurity concentration are formed on the drain region 46 by means of an epitaxial growth. Further, the n-type silicon thin films 49 and 51 are formed on the p-type silicon thin films 48 and 50 by means of an epitaxial growth. As a result, these silicon thin films have a good quality making it possible to control easily the impurity concentration. It follows that it is possible to form a pn junction having a steep impurity profile.

It should be noted that the p-type silicon thin film 48 having a high impurity concentration and the n-type silicon thin film 49 having a high impurity concentration collectively form an Esaki diode D$_1$. On the other hand, the drain region 46 having a high impurity concentration and the p-type silicon thin film 50 having a high impurity concentration collectively form an Esaki diode D$_2$. Since a reversed bias is kept applied across the pn junction formed between the n-type silicon thin film 51 having a high impurity concentration and the p-type silicon thin film 50 having a high impurity concentration, the n-type silicon thin film 51 simply acts as a resistor layer and does not give rise to any difficulty in terms of the function of the memory cell.

A second insulating film 54 is formed in a manner to divide the pn junction formed between the p-type and n-type silicon thin films into two parts. It is seen that the second insulating film 54 is formed to cover the upper surfaces of the n-type silicon thin films 49 and 51. Also, the low potential power source line (V$_{SS}$) 55 and the high potential power source line (V$_{DD}$) 56 are connected to the n-type silicon thin films 49 and 51, respectively. On the other hand, a bit line (BL) 57 is connected to the source region 45 through a contact hole formed through the first insulating film 47 and the second insulating film 54.

As described above in detail, a laminate structure of SOI structure is employed in the present invention so as to form a MOS transistor and an Esaki diode in a superposed fashion. Thus, it is possible to diminish the area occupied by the memory cell. In addition, it is possible to prepare an SRAM including an Esaki diode exhibiting excellent characteristics.

It should also be noted that two tunnel diodes are formed on one of the two impurity regions of an FET in the present invention, making it possible to provide easily an SRAM exhibiting good characteristics stably. Also, the SRAM can be miniaturized. What should also be noted is that, in the present invention, the Esaki diode constituting a memory cell is formed by self-alignment using a solid phase diffusion, making it possible to provide a miniaturized SRAM capable of exhibiting good characteristics stably with a small power consumption.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device, comprising:
a semiconductor substrate;

a MOS transistor formed in said substrate, said MOS transistor including a first region, a second region and a gate electrode;

a word line connected to the gate electrode of said MOS transistor;

a bit line connected to the second region of the MOS transistor;

an insulating film formed on the substrate having the MOS transistor formed therein;

a semiconductor film formed on said insulating film and connected to the first region of the MOS transistor; and an Esaki diode means formed in said semiconductor film and serving to form a memory node.

2. The semiconductor memory device according to claim 1, wherein said Esaki diode means includes first and second Esaki diodes which are formed in series and said memory node is connected to a connection node between said first and second Esaki diodes.

3. The semiconductor memory device according to claim 1, which further comprises a capacitor connected in parallel to said Esaki diode means, said capacitor being formed of a capacitor insulating film formed on the semiconductor film and a capacitor electrode formed on the capacitor insulating film.

4. A semiconductor memory device, comprising:
a silicon substrate;
a plurality of MOS transistors formed in said substrate, each of said MOS transistors including a first region, a second region and a gate electrode;
a word line connected to said gate electrode of each of said plurality of MOS transistors;
a bit line connected to the second region of selected of said plurality of MOS transistors;
an insulating film formed on the substrate having said plurality of MOS transistors formed therein;
a semiconductor film formed on said insulating film and connected to the first region of each of said plurality of MOS transistors; and
a plurality of Esaki diodes formed in said semiconductor film and serving to form a plurality of memory nodes.

5. The semiconductor memory device according to claim 4, which further comprises a capacitor connected in parallel to one of said plurality of Esaki diodes, said capacitor being formed of a capacitor insulating film formed on the semiconductor film and a capacitor electrode formed on said capacitor insulating film.

6. The semiconductor memory device according to claim 4, wherein said semiconductor film is patterned in parallel with said word line.

7. The semiconductor memory device according to claim 4, wherein p-type regions and n-type regions are formed alternatively in said semiconductor film in a lateral direction so as to form a plurality of pn junctions and, thus, to form first and second Esaki diodes.

8. The semiconductor memory device according to claim 7, wherein an insulating film is formed on said semiconductor film having said first and second Esaki diodes formed therein, and one of said bit lines connected to the second region of one of said plurality of MOS transistors, a high potential power source line connected to said p-type region of said first Esaki diode, and a low potential power source line connected to an n-type region of said second Esaki diode are formed to cross the word line connected to said one MOS transistor.

9. The semiconductor memory device according to claim 7, which further comprises a short circuiting electrode serving to achieve a short circuiting between the n-type region of said first Esaki diode and said p-type region of said second Esaki diode.

10. The semiconductor memory device according to claim 4, wherein one of said plurality of MOS transistors and two of said plurality of Esaki diodes collectively form a memory cell, and a high potential power source line and a low potential power source line are shared by a memory cell positioned adjacent to the memory cell formed by said one MOS transistor and said two of said plurality of Esaki diodes.

11. The semiconductor memory device, comprising:
MOS transistors forming a plurality of memory cells, arranged in one direction, each including a gate electrodes said gate electrodes being connected to provide a word line;
a semiconductor film patterned to extend in parallel with said word line and contacts each of source regions of said MOS transistors via an opening formed above said source regions;
pn-junctions formed in said semiconductor film to extend in a lateral direction so as to form first and second Esaki diodes;
a capacitor electrode formed on said semiconductor film having said first and second Esaki diodes arranged therein, with a capacitor insulating film interposed between said capacitor electrode and said semiconductor film;
a bit line connected to selected of drain regions of said MOS transistors, a high potential power source line connected to a p-type region of said first Esaki diode, and a low potential power source line connected to an n-type region of said second Esaki diode are respectively formed to cross said word line; and
a short circuiting electrode formed to achieve short circuiting between said n-type region of said first diode and said p-type region of said second Esaki diode.

* * * * *